(12) United States Patent
Hayashi

(10) Patent No.: US 8,168,895 B2
(45) Date of Patent: May 1, 2012

(54) PRINTED WIRING BOARD

(75) Inventor: Seiji Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 501 days.

(21) Appl. No.: 12/534,834

(22) Filed: Aug. 3, 2009

(65) Prior Publication Data

US 2010/0032195 A1 Feb. 11, 2010

(30) Foreign Application Priority Data

Aug. 7, 2008 (JP) ................. 2008-203734
Jun. 18, 2009 (JP) ................. 2009-145453

(51) Int. Cl.
*H05K 1/18* (2006.01)
*H05K 1/14* (2006.01)

(52) U.S. Cl. .............. 174/260; 174/262; 257/758

(58) Field of Classification Search ........... 174/260
See application file for complete search history.

(56) References Cited

U.S. PATENT DOCUMENTS

| | | | |
|---|---|---|---|
| 5,965,872 A | 10/1999 | Endo et al. | |
| 5,969,421 A | 10/1999 | Smooha | |
| 6,049,074 A | 4/2000 | Endo et al. | |
| 8,056,039 B2 * | 11/2011 | Chanda et al. | 716/115 |
| 2005/0051894 A1 | 3/2005 | Kim et al. | |
| 2006/0087024 A1 | 4/2006 | Hosomi | |

FOREIGN PATENT DOCUMENTS

WO 2008/018160 A1 2/2008

OTHER PUBLICATIONS

European Search Report in corresponding European Application No. 09167291.5, dated Nov. 6, 2009.
A. Dixit et al., "Effect of Non-uniform Current Distribution in the Via Patterns on Microelectronics Reliability", Proceedings Annual Reliability and Maintainability Symposium, 1993, pp. 422 to 427.
IBM Corp., "Voltage Distribution Interconnects on Multi-Layer Printed Circuit Boards", IBM Technical Disclosure Bulletin, vol. 33 No. 4, Sep. 1990, pp. 128-130.
Jens Lienig, "Invited Talk: Introduction to Electromigration-Aware Physical Design", Dresden University of Technology, Institute of Electromechanical and Electronic Design (IFTE), Apr. 2006, pp. 39 to 46.
S. Hayashi, U.S. Appl. No. 12/522,100, filed on Jul. 2, 2009.
"Design Wave Magazine", Feb. 2007, pp. 86-87.

* cited by examiner

*Primary Examiner* — Timothy Thompson
*Assistant Examiner* — Hiram E Gonzalez
(74) *Attorney, Agent, or Firm* — Fitzpatrick, Cella, Harper & Scinto

(57) ABSTRACT

Provided is a multilayer printed wiring board in which multiple via holes that connect a first power supply wiring with a second power supply wiring are aligned in a line in parallel to a direction along which current flows. In order to prevent current from being concentrated on the via hole connected to a farthest end of the power supply wiring among the via holes, a narrow portion between the via hole and the via hole is narrowed to increase a resistance. A narrow portion that is narrowed is disposed similarly at a farthest end of the power supply wiring of the second conductor layer.

9 Claims, 5 Drawing Sheets

PRINTED WIRING BOARD

BACKGROUND OF THE INVENTION

1. Field of the Invention

The present invention relates to a printed wiring board mounted on an electronic device or the like.

2. Description of the Related Art

A printed wiring board mounted on an electronic device is designed with a limited area which is attributable to the size of the device. For the purpose of mounting a large number of wirings on the printed wiring board with the limited area, a multilayer printed wiring board with a multilayer structure has been generally employed. In the multilayer printed wiring board, the wirings each formed on a different layer are connected to each other through via holes (or through-holes) formed in a direction perpendicular to a surface of the printed wiring board.

In recent years, the power consumption of a semiconductor device mounted on the printed wiring board has increased, which leads to a tendency of increase in current flowing in a power supply wiring of the printed wiring board. As a result, a large current, which has been conventionally flowing only in a printed wiring board for power supply on which a power supply circuit is mounted, is also flowing in a multilayer printed wiring board that allows a high-speed signal to flow therein and is densely packed, such as a printed wiring board for a CPU or a printed wiring board for image processing.

In general, the multilayer printed wiring board high in processing speed and high in density includes a via hole having a smaller diameter and a smaller amount of current flows therein per via hole as compared with the printed wiring board for power supply on which the power supply circuit is mounted. For that reason, when a large current flows therein, the via holes are relatively easily cut. In other words, a small via hole is more easily burnt out or prevented from being conductive when a current is high.

As a countermeasure against the above-mentioned problem, "Design Wave Magazine" February 2007 discloses a connection method in which via holes are aligned in a line perpendicularly to the wiring direction on connection portions of power supply wirings on different wiring layers, as illustrated in FIG. 5A. FIG. 5A illustrates a multilayer printed wiring board 201, of which only two wiring layers are illustrated. A first power supply wiring 202 is disposed on a first wiring layer, and a second power supply wiring 203 is disposed on a second wiring layer. The first power supply wiring 202 and the second power supply wiring 203 are connected to each other through multiple via holes 210, 211, 212, and 213 that are aligned in a line. The provision of the multiple via holes enables the amount of current flowing in one via hole per unit time to be reduced, and hence the reliability of the via holes can be improved.

However, when the multiple via holes are arranged as described above, a larger overlapping area of the first power supply wiring and the second power supply wiring, which are connected to each other through the via holes, is required than that in the conventional art. Further, when the through via holes are used in the multilayer printed wiring board, all of the wiring layers are pierced, and a wiring area of wiring layers other than the first power supply wiring and the second power supply wiring is narrowed. This causes a major obstacle to higher density of the printed wiring board.

In terms of the reliability, it is desirable that the amount of current flowing in one via hole per unit time be smaller, and the number of via holes be larger. Conversely, in terms of the higher-density wiring, it is desirable that the number of via holes be smaller. Accordingly, the optimum number of via holes is the smallest natural number which is equal to or larger than a value obtained by dividing a current value required to flow in at least the power supply wiring by a current value allowed to flow in one via hole.

The via holes 210, 211, 212, and 213 are equivalent in load-bearing capability to the power supply wirings 202 and 203. However, according to the experiments carried out by the inventor of the present invention, in the case of the printed wiring board illustrated in FIG. 5A, the via hole 210 or 213 is in fact always fractured and cannot carry a current load. In the case of the real printed wiring board, unlike a notional circuit diagram, power supply wirings 202a to 202c and power supply wirings 203a to 203c are disposed between the respective adjacent via holes. Accordingly, the respective via holes are not electrically equivalent to each other with influence of the power supply wirings 202a to 202c and 203a to 203c disposed between the respective adjacent via holes, with the result that the flowing current value is varied.

A description is given of the current value of the current flowing between the respective via holes in the printed wiring board illustrated in FIG. 5A with reference to FIG. 5B being a circuit diagram equivalent to the schematic drawing of FIG. 5A. It is assumed that the current value of current flowing into the power supply wiring 202 is I, resistance values of the via holes 210, 211, 212, and 213 are rv, and resistance values of the power supply wirings 202a to 202c between the respective adjacent via holes are rx, ry, and rz, respectively Likewise, it is assumed that resistance values of the power supply wirings 203a to 203c are also rx, ry, and rz, respectively. It is assumed that the current values of current flowing in the power supply wirings 202a to 202c are ia, ib, and ic, respectively. It is assumed that the current values of current flowing in the via holes 210 to 212 are id, ie, and if, respectively. The current value of current flowing in the via hole 213 is equal to the current value ic of current flowing in the power supply wiring 202c (because these two portions of wiring, 202c and 213 are in series with no path coming into the wire or leaving it to increase or decrease the current value). The current value of current flowing in the power supply wiring 203a is equal to the current value id of current flowing in the via hole 210 for the same reason as above. It is assumed that the current values of current flowing in the power supply wirings 203b and 203c are ig and ih, respectively.

In the case of the equivalent circuit of FIG. 5B, the current value of current flowing in the via hole 210 can be obtained by the following Expression (1).

$$id = \frac{4r_x r_y r_z + 4r_x r_y r_v + 2r_y r_z r_v + 4r_z r_x r_v +}{8r_x r_y r_z + 8r_x r_y r_v + 8r_y r_z r_v + 8r_z r_x r_v +} I \quad \text{(Equation 1)}$$
$$\frac{2r_x r_v^2 + 2r_y r_v^2 + r_z r_v^2 + r_v^3}{6r_x r_v^2 + 8r_y r_v^2 + 6r_z r_v^2 + 4r_v^3}$$

The current values ia, ib, and ic of current flowing in the power supply wirings 202a to 202c can be obtained by the following Expressions (2) to (4), respectively.

$$ia = I - id \quad \text{(Equation 2)}$$

$$ib = \frac{r_x + r_v}{r_v} I - \frac{2r_x + 2r_v}{r_v} id \quad \text{(Equation 3)}$$

$$ic = \frac{2r_xr_y + r_yr_v + 2r_xr_v + r_v^2}{r_v^2}I - \frac{4r_xr_y + 4r_yr_v + 4r_xr_v + 3r_v^2}{r_v^2}id \quad \text{(Equation 4)}$$

The current values ie and if of current flowing in the via holes 211 and 212 can be obtained by the following Expressions (5) and (6), respectively.

$$ie = \frac{2r_x + r_v}{r_v}id - \frac{r_x}{r_v}I \quad \text{(Equation 5)}$$

$$if = \frac{4r_xr_y + 4r_yr_v + 2r_xr_v + r_v^2}{r_v^2}id - \frac{2r_xr_y + r_yr_v + r_xr_v}{r_v^2}I \quad \text{(Equation 6)}$$

The current values ig and ih of current flowing in the power supply wirings 203b and 203c can be obtained by the following Expressions (7) and (8), respectively.

$$ig = \frac{2r_x + r_v}{r_v}id - \frac{r_x}{r_v}I \quad \text{(Equation 7)}$$

$$ih = \frac{4r_xr_y + 4r_yr_v + 4r_xr_v + 3r_v^2}{r_v^2}id - \frac{2r_xr_y + r_yr_v + r_xr_v}{r_v^2}I \quad \text{(Equation 8)}$$

A specific example of the above is described. As illustrated in FIG. 5C, it is assumed that the current value of current flowing into the power supply wiring 202 is I=4A, inner diameters of the via holes 210, 211, 212, and 213 are Φ=0.3 mm, and resistance values of the via holes 210, 211, 212, and 213 are rv=0.36 mΩ. It is assumed that the resistance values of the power supply wirings 202a and 203a are rx=0.6 mΩ, the resistance values of the power supply wirings 202b and 203b are ry=0.6 mΩ, and the resistance values of the power supply wirings 202c and 203c are rz=0.6 mΩ. It is assumed that resistance values of the first and second power supply wirings 202 and 203 between the respective adjacent via holes are 2.0 mΩ.

When calculation is made using Expressions (1) to (8), the current values of current flowing in the via holes 210 to 213 are id=1.58 A, ie=0.42 A, if=0.42 A, and ic=1.58 A, respectively.

When it is assumed that the amount of current allowed to flow in one via hole is 1 A, a current of the amount equal to or larger than the allowed amount flows in the via holes 210 and 213 so that the via holes are disconnected (i.e. they are burnt out or fractured).

SUMMARY OF THE INVENTION

It is an object of the present invention to enhance reliability of a printed wiring board and to enable the printed wiring board to be densely packed by causing a large amount of current to flow without increasing the number of via holes when power supply wirings on different wiring layers are connected to each other through multiple via holes.

According to the present invention, a laminated printed wiring board includes: a first conductor layer in which a first power supply wiring is formed; a second conductor layer in which a second power supply wiring is formed; and a series of at least three via holes arranged in a longitudinal direction of the first and second power supply wirings and connecting an end area of the first power supply wiring to an end area of the second power supply wiring, wherein the end area of the first power supply wiring includes: a first portion defined between a first via hole which is closest from the end of the first power supply wiring and a next via hole of the first via hole in the series of via holes; and a second portion defined between a last via hole which is closest from the end of the second power supply wiring and the next via hole of the first via hole, the end area of the second power supply wiring is arranged such that it includes: a first portion defined between the last via hole and a next via hole of the last via hole in the series of via holes; and a second portion defined between the first via hole and the next via hole of the last via hole, and the first portion of the end area of the first power supply wiring has a larger resistance value than the second portion of the end area of the first power supply wiring, and the first portion of the end area of the second power supply wiring has a larger resistance value than the second portion of the end area of the second power supply wiring.

According to the present invention, when power supply wirings of different wiring layers are connected to each other through multiple via holes, the amount of current flowing in the respective via holes are averaged, thereby enabling the number of via holes or the like to be used to be minimized. As a result, the via hole area in the power supply wirings can be reduced, and the printed wiring board can be densely packed. Further, the concentration of current on a specific via hole is prevented, thereby enabling the reliability of a product having the printed wiring board mounted therein to be improved.

Further features of the present invention become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1A:
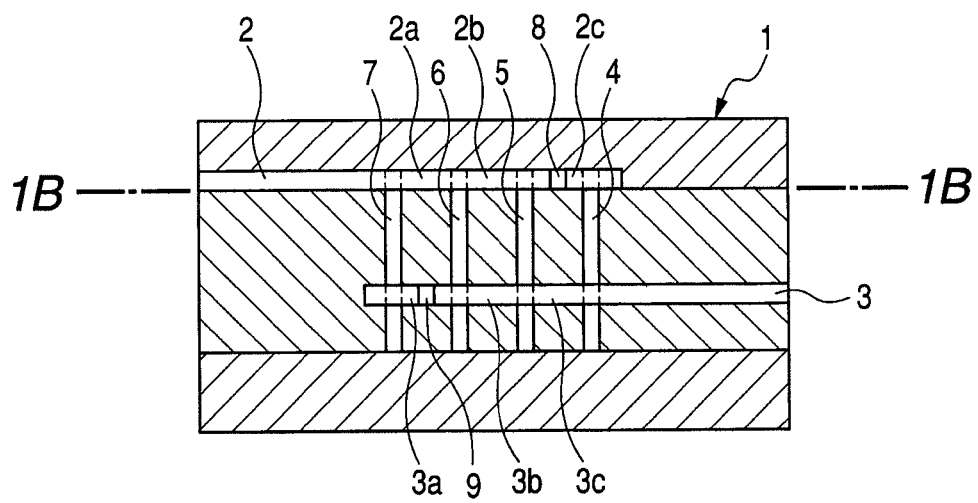
FIGS. 1A and 1B are a cross-sectional view and a plan view illustrating a printed wiring board according to Example 1, respectively.

FIG. 1A is a cross-sectional view illustrating a multilayer printed wiring board 1 according to an embodiment of the present invention. In FIG. 1A, only two wiring layers are sampled and illustrated. A first power supply wiring 2 is disposed in a first wiring layer, and a second power supply wiring 3 is disposed in a second wiring layer. The first power supply wiring 2 and the second power supply wiring 3 are connected to each other through multiple via holes 4, 5, 6, and 7 which are aligned in a line. A power supply wiring 2a is disposed between the via holes 7 and 6 of the power supply wiring 2, a power supply wiring 2b is disposed between the via holes 6 and 5 thereof, and a power supply wiring 2c is disposed between the via holes 5 and 4 thereof. A power supply wiring 3a is disposed between the via holes 7 and 6 of the power supply wiring 3, a power supply wiring 3b is disposed between the via holes 6 and 5 thereof, and a power supply wiring 3c is disposed between the via holes 5 and 4 thereof.

Figure 1B:
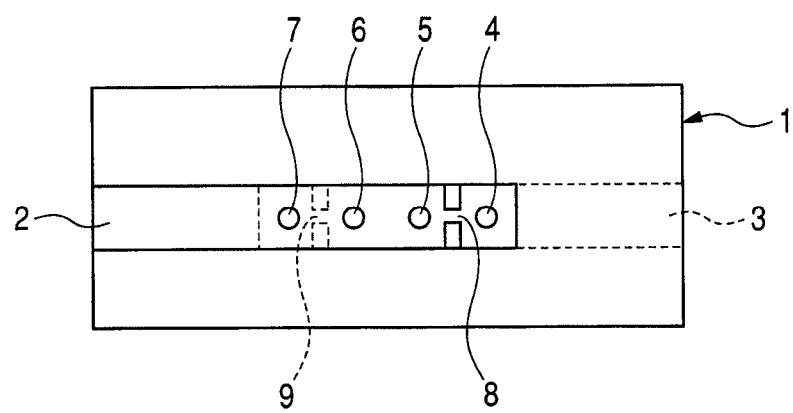

FIG. 1B is a plan view taken along a line 1B-1B of FIG. 1A. FIG. 1B is a top view of the multilayer printed wiring board 1 according to the embodiment of the present invention. Referring to FIG. 1B, an end of the first power supply wiring 2 and an end of the second power supply wiring 3 overlap with each other.

The power supply wiring 2c between the via holes 5 and 4 of the power supply wiring 2 is provided with a narrow portion 8 whose wiring width is narrowed as compared with other areas of the power supply wiring 2. Likewise, the power supply wiring 3a between the via holes 7 and 6 of the power supply wiring 3 is provided with a narrow portion 9 whose wiring width is narrowed as compared with other areas of the power supply wiring 3.

The narrow portions 8 and 9 are high-resistant wiring areas that increase the resistance values of the power supply wirings 2c and 3a, and can prevent current from being concentrated on the via hole 4 at the farthest end of the first power supply wiring 2 and the via hole 7 at the farthest end of the second power supply wiring 3. The resistance values of the power supply wirings 2c and 3a can be so adjusted as to average the amount of current flowing in the via holes 4 to 7 per unit time. The averaging of the amount of current can improve the reliability of respective via holes, and increase the amount of current allowed to flow in the power supply wirings 2 and 3.

An insulator used for the printed wiring board is optimally made of FR4 (heat resistant glass cloth base epoxy resin) in terms of costs, stability, and so on. Alternatively, the insulator may be made of FR-1 (heat resistant paper base phenolic resin) or ceramic. A conductor layer with the power supply wiring may be an inner layer or an outer layer of the printed wiring board. The via holes can be formed by drilling through-holes and plating inner circumferential surfaces of the through-holes.

Further, the present invention is applicable to, in addition to the above-mentioned multilayer printed wiring board, a case in which a power supply wiring of a semiconductor package and the power supply wiring of the printed wiring board are connected by a solder ball or the like. The smaller diameter of the solder ball has been progressively developed, and hence the configuration of the present invention is very effective in this case.

Further, the present invention is applicable to a case in which a large amount of current flows in a signal wiring instead of the first power supply wiring and the second power supply wiring described above.

The power supply wiring in the present invention includes not only a linear wiring but also a patterned power supply wiring large in area.

Example 1

The amount of current flowing in the respective via holes 4, 5, 6, and 7 were obtained by using the printed wiring board illustrated in FIGS. 1A and 1B. In this example, an allowable current amount being a limit value of current allowed to flow without cutting off the via hole is set to 1 A.

The wiring widths of the power supply wirings 2 and 3 were set to 0.5 mm, and the wiring widths of the narrow portions 8 and 9 were set to 0.15 mm to provide a high resistant wiring area. A current value of current flowing into the power supply wiring 2 was set to I=3 A, and resistant values of the via holes 4, 5, 6, and 7 were set to rv=0.36 mΩ. Resistance values of the power supply wirings 2a and 3a were set to rx=0.6 mΩ, resistance values of the power supply wirings 2b and 3b were set to ry=0.6 mΩ, and resistance values of the power supply wirings 2c and 3c were set to rz=0.6 mΩ. Resistance values of the first and second power supply wirings 202 and 203 between the respective adjacent via holes were set to 2.0 mΩ.

Comparative Example 1

Comparative Example 1 has a configuration in which the narrow portions 8 and 9 of Example 1 are not provided, and the wiring widths of the power supply wirings 2c and 3a are 0.5 mm.

The amount of current flowing in the via holes 4, 5, 6, and 7 in Example 1 and Comparative Example 1 are shown in Table 1.

TABLE 1

| | Via hole 4 | Via hole 5 | Via hole 6 | Via hole 7 |
|---|---|---|---|---|
| Comparative Example 1 | 1.20 A | 0.30 A | 0.30 A | 1.20 A |
| Example 1 | 0.77 A | 0.73 A | 0.73 A | 0.77 A |

As is apparent from Table 1, in the case of Comparative Example 1, a current of 1.20 A flows in the via holes 4 and 7, and the possibility that the via holes 4 and 7 are cut off is very high (if they have a maximum current load capacity of 1 A). On the contrary, according to Example 1, with the provision of the narrow portions 8 and 9, the amount of current flowing in the via holes 4, 5, 6, and 7 could be averaged to 0.73 to 0.77 A being a value equal to or smaller than 1 A and preventing cut-off of the via holes.

Ideally, when a current of 3 A is caused to flow, if the same amount of current flows in the four via holes, a current of 0.75 A flows in each via hole. As is apparent from Example 1, the resistance values of the power supply wirings 2c and 3a are adjusted by the narrow portions 8 and 9, thereby enabling substantially ideal current averaging to be realized.

Example 2

Figure 2A:
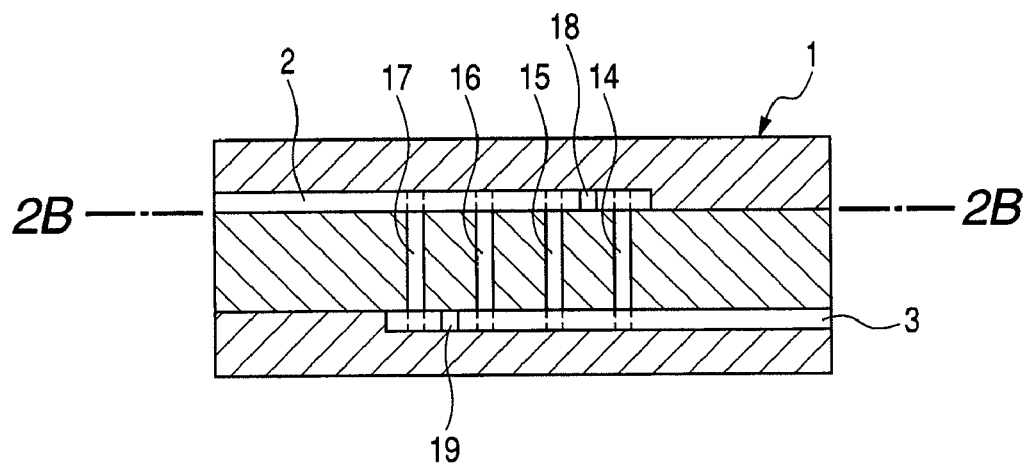
FIGS. 2A and 2B are a cross-sectional view and a plan view illustrating a printed wiring board according to Example 2, respectively.
Figure 2B:
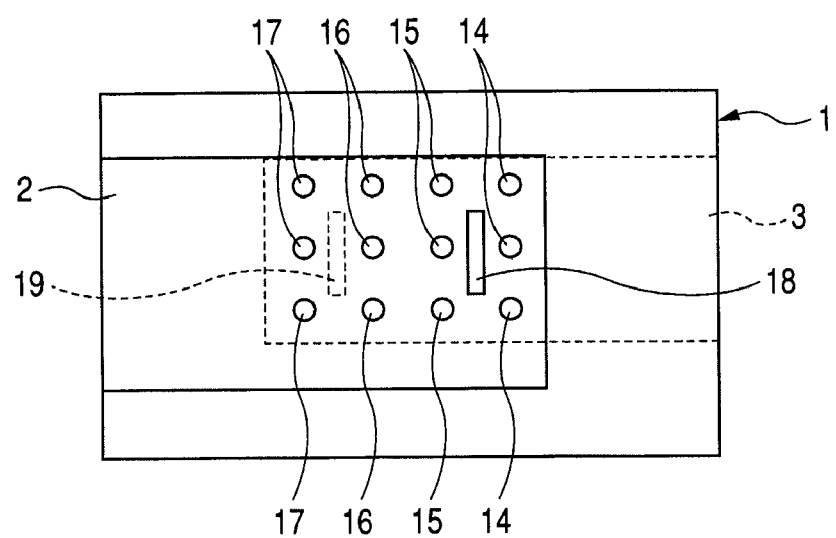

FIG. 2A is a cross-sectional view illustrating a printed wiring board according to Example 2 of the present invention. FIG. 2B is a plan view taken along a line 2B-2B of FIG. 2A. In FIGS. 2A and 2B, the same members as those of Example 1 are denoted by identical symbols, and their description is omitted.

The multilayer printed wiring board 1 is provided with the power supply wiring 2 and the power supply wiring 3. In the power supply wiring 2 are formed multiple via holes connected to the power supply wiring 3. Unlike Example 1, the via holes in this example are configured such that via hole groups each including three via holes are disposed in four lines along the wiring direction of the power supply wirings 2 and 3. Via hole groups 14, 15, 16, and 17 are disposed in the stated order from the farthest end of the power supply wiring 2. By "furthest end," what is understood is the end of the power supply wiring 2 that is furthest from its entry point into the printed wiring board 1.

A slit 18 is provided between the via hole group 14 and the via hole group 15 adjacent thereto in the power supply wiring 2, and a slit 19 is provided between the via hole group 17 and the via hole group 16 adjacent thereto in the power supply wiring 3. The slits 18 and 19 make a resistance value between the via hole group 14 and the via hole group 15 and a resistance value between the via hole group 17 and the via hole group 16 larger than the wiring resistance values of other portions of the power supply wirings 2 and 3. As a result, the current flowing in the via hole group 14 and the via hole group 17 is reduced. The amount of current flowing in the via hole groups 14, 15, 16, and 17 can be averaged in this two-dimensional array of via holes in the same way as in the one-dimensional array of via holes of Example 1 above.

Example 3

Figure 3A:
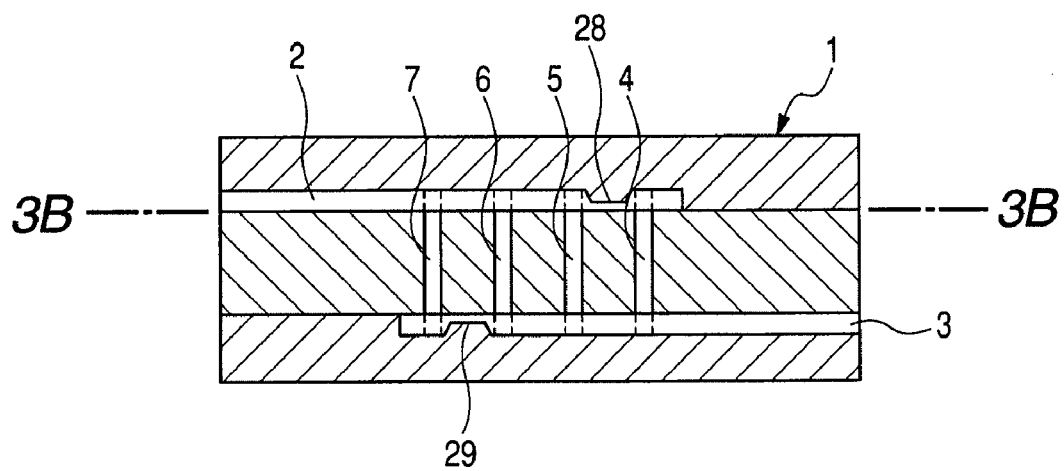
FIGS. 3A and 3B are a cross-sectional view and a plan view illustrating a printed wiring board according to Example 3, respectively.
Figure 3B:
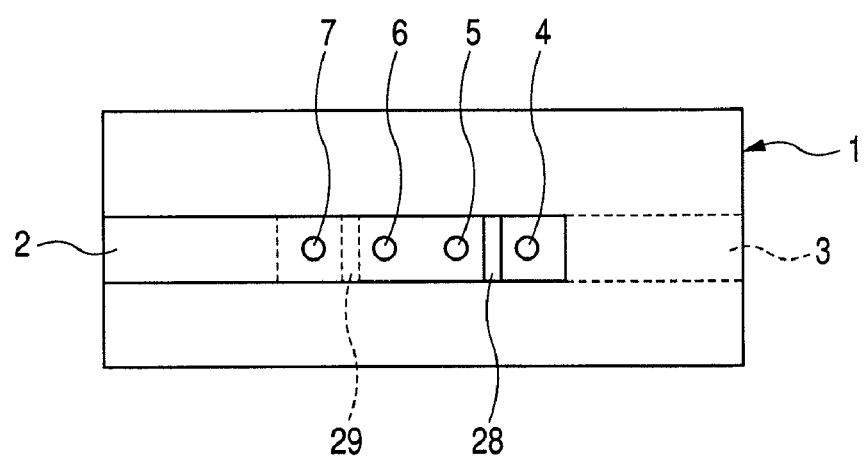

FIG. 3A is a cross-sectional view illustrating a printed wiring board according to Example 3 of the present invention. FIG. 3B is a plan view taken along a line 3B-3B of FIG. 3A. In FIGS. 3A and 3B, the same members as those of Example 1 are denoted by identical symbols, and their description is omitted.

In this example, a thin portion 28 thinner in conductor thickness than other portions of the power supply wiring 2 is formed between the via hole 4 and the via hole 5 adjacent thereto in the power supply wiring 2. Likewise, a thin portion 29 thinner in conductor thickness than other portions of the power supply wiring 3 is formed between the via hole 7 and the via hole 6 adjacent thereto in the power supply wiring 3. The thin portion 28 and the thin portion 29 are higher in resistance value than other portions of the power supply wirings 2 and 3, respectively. As a result, it is difficult for the current to flow in a route including the thin portion 28 and the via hole 4 and a route including the thin portion 29 and the via hole 7, and it is relatively easy for the current to flow in the via holes 5 and 6. With the above-mentioned configuration, the amount of current flowing in the via holes 4, 5, 6, and 7 can be averaged in the same way as the one-dimensional solution in Example 1 above.

Example 4

Figure 4A:
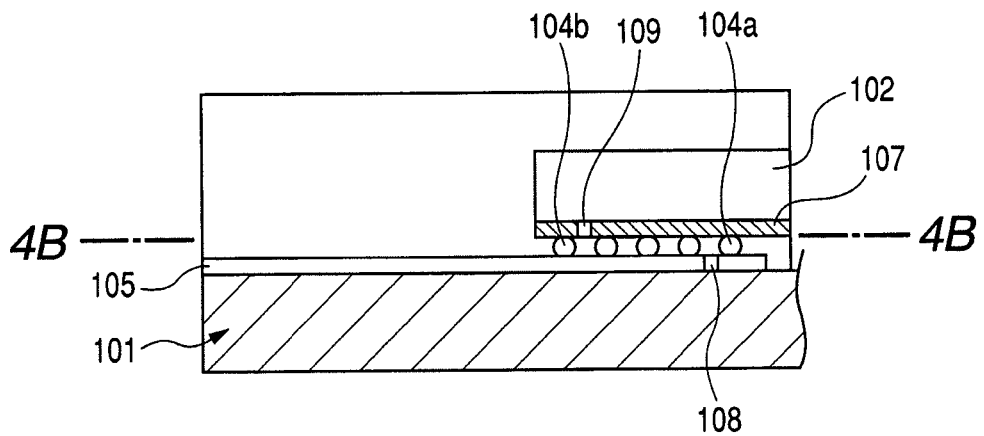
FIGS. 4A and 4B are a cross-sectional view and a plan view illustrating a printed wiring board according to Example 4, respectively.
Figure 4B:
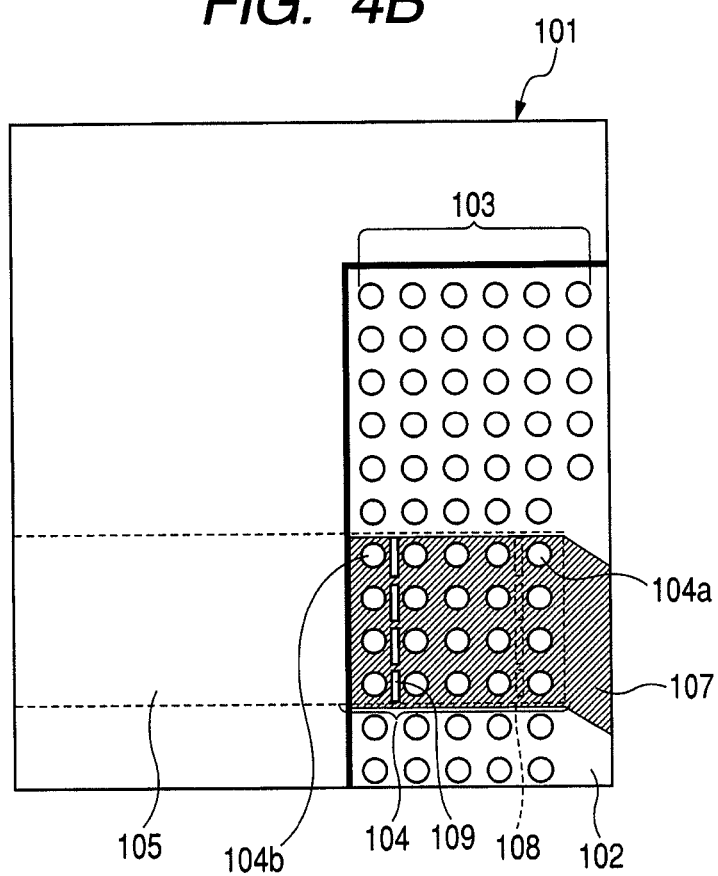
Figure 5A:
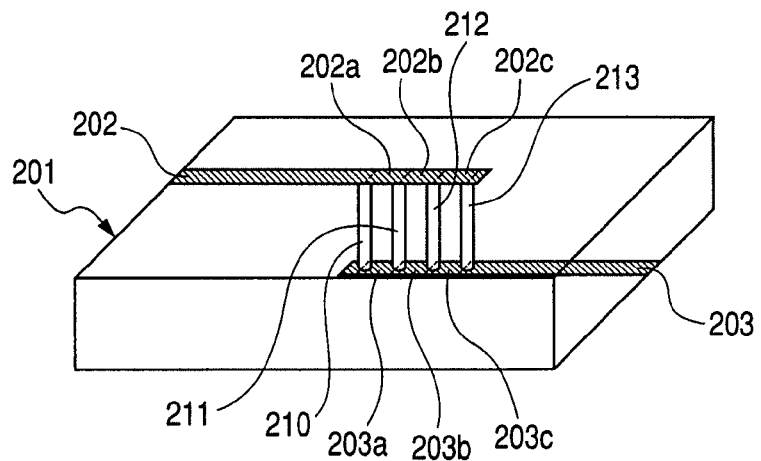
FIGS. 5A, 5B, and 5C are a view illustrating a printed wiring board and circuit diagrams of the printed wiring board, respectively.
Figure 5B:
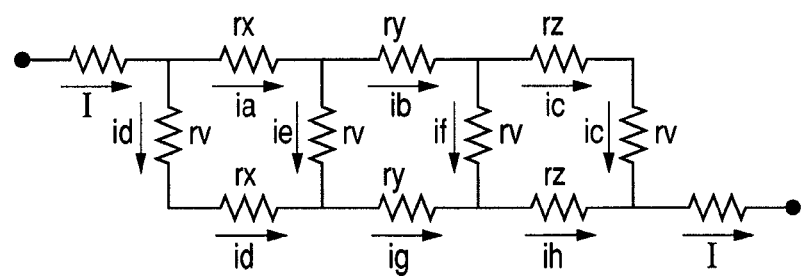
Figure 5C:
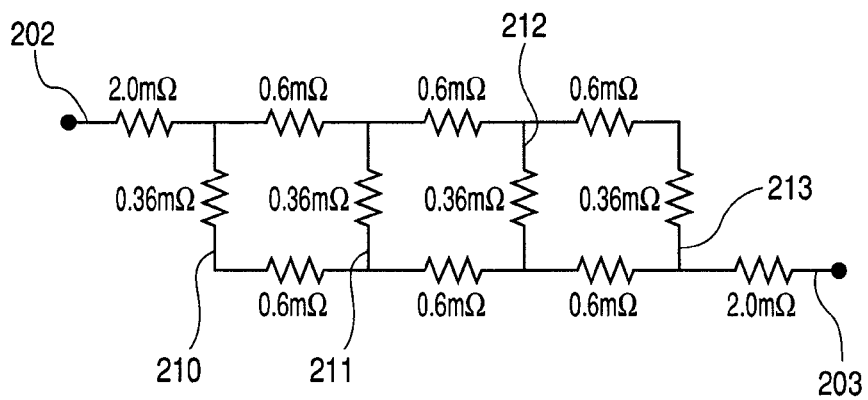

FIG. 4A is a cross-sectional view illustrating a mounting structure of a printed wiring board according to Example 4 of the present invention. FIG. 4B is a plan view taken along a line 4B-4B of FIG. 4A.

In this example, a package substrate 102 of a circuit component is mounted on a printed wiring board 101 through a solder ball group 104 being a two-dimensional array of multiple conductive members. A semiconductor integrated circuit is mounted on the package substrate 102, and current flows from the left to the right of FIGS. 4A and 4B. A solder ball group 103 is for an arbitrary signal or power supply. The solder ball group 104 is a terminal of a circuit belonging to a power supply system different from that of the solder ball group 103. The power supply to that circuit (i.e. the solder ball group 104) is conducted through a power supply wiring 105 of the printed wiring board 101, the solder ball group 104, and a power supply wiring 107 of the package substrate 102 which serve as a path. Slits 108 are defined in an end of the power supply wiring 105 on the printed wiring board 101, and slits 109 are similarly defined in an end of the power supply wiring 107 on the package substrate 102. For the purpose of preventing current from being concentrated on the solder balls 104a and 104b located at the farthest ends in a direction in which current flows, the respective slits 108 and 109 are disposed to increase the resistance of current supply paths to the solder balls 104a and 104b, respectively.

With the above-mentioned configuration, the amount of current of the solder ball group for power supply is leveled so that the number of solder balls can be minimized, and the mounting structure of the printed wiring board can be downsized.

According to the present invention, when power supply wirings of different wiring layers are connected to each other through multiple via holes, the amount of current flowing in the respective via holes are averaged, thereby enabling the number of via holes or the like to be used to be minimized. As a result, the via hole area in the power supply wirings can be reduced, and the printed wiring board can be densely packed. Further, the concentration of current on a specific via hole is prevented, thereby enabling the reliability of a product having the printed circuit board mounted therein to be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-203734, filed Aug. 7, 2008, and Japanese Patent Application No. 2009-145453, filed Jun. 18, 2009, which are hereby incorporated by reference herein in their entirety.

What is claimed is:

1. A laminated printed wiring board comprising:
   a first conductor layer in which a first power supply wiring is formed;
   a second conductor layer in which a second power supply wiring is formed; and
   a series of at least three via holes arranged in a longitudinal direction of the first and second power supply wirings and connecting an end area of the first power supply wiring to an end area of the second power supply wiring, wherein
   the end area of the first power supply wiring comprises:
   a first portion defined between a first via hole which is closest from the end of the first power supply wiring and a next via hole of the first via hole in the series of via holes; and
   a second portion defined between a last via hole which is closest from the end of the second power supply wiring and a next via hole of the last via hole,
   the end area of the second power supply wiring is arranged such that it comprises:
   a first portion defined between the last via hole and a next via hole of the last via hole in the series of via holes; and
   a second portion defined between the first via hole and the next via hole of the first via hole, and
   the first portion of the end area of the first power supply wiring has a larger resistance value than the second portion of the end area of the first power supply wiring, and
   the first portion of the end area of the second power supply wiring has a larger resistance value than the second portion of the end area of the second power supply wiring.

2. The laminated printed wiring board according to claim 1, wherein the first portion of the end area of the respective power supply wiring comprises a wiring which is narrower than wiring width of the second portion of the end area of the respective power supply wiring.

3. The laminated printed wiring board according to claim 1, wherein the first portion of the end area of the respective power supply wiring comprises a wiring having a thickness which is thinner than wiring thickness of the second portion of the end area of the respective power supply wiring.

4. The laminated printed wiring board according to claim 1, wherein the first portion of the end area of the respective power supply wiring has a cutout portion.

5. The laminated printed wiring board according to claim 1, wherein the series of via holes is repeated across a width of the respective power supply wiring to form a two-dimensional away of via holes.

6. A printed circuit board comprising:
- a printed wiring board having a first power supply wiring formed therein;
- a semiconductor package which is mounted on the printed wiring board and includes a conductor layer having a second power supply wiring formed therein; and
- a series of at least three connections connecting an end area of the first power supply wiring to an end area of the second power supply wiring, wherein the end area of the first power supply wiring comprises:
- a first portion defined between a first connection which is closest from the end of the first power supply wiring and a next connection of the first connection in the series of connections; and
- a second portion defined between a last connection which is closest from the end of the second power supply wiring and the next connection of the last connection, the end area of the second power supply wiring is arranged such that it comprises:
- a first portion defined between the last connection and a next connection of the last connection; and
- a second portion defined between the first connection and the next connection of the first connection, and the first portion of the end area of the first power supply wiring has a larger resistance value than the second portion of the end area of the first power supply wiring, and the first portion of the end area of the second power supply wiring has a larger resistance value than the second portion of the end area of the second power supply wiring.

7. The printed circuit board according to claim 6, wherein the first portion of the end area of the respective power supply wiring comprises a wiring which is narrower than wiring width of the second portion of the end area of the respective power supply wiring.

8. The printed circuit board according to claim 6, wherein the first portion of the end area of the respective power supply wiring comprises a wiring having a thickness which is thinner than wiring thickness of the second portion of the end area of the respective power supply wiring.

9. The printed circuit board according to claim 6, wherein the at least three connections are formed by soldering.

\* \* \* \* \*